US007745786B2

(12) United States Patent
Fama et al.

(10) Patent No.: US 7,745,786 B2
(45) Date of Patent: Jun. 29, 2010

(54) METHOD AND APPARATUS ALLOWING SIMULTANEOUS DIRECT OBSERVATION AND ELECTRONIC CAPTURE OF SCINTILLATION IMAGES IN AN ELECTRON MICROSCOPE

(76) Inventors: Leo A. Fama, 22 Yale St., Winchester, MA (US) 01890; James F. Mancuso, 50 Prospect St., Rowley, MA (US) 01969

( * ) Notice: Subject to any disclaimer, the term of this patent is extended or adjusted under 35 U.S.C. 154(b) by 311 days.

(21) Appl. No.: 12/051,514

(22) Filed: Mar. 19, 2008

(65) Prior Publication Data

US 2009/0236520 A1 Sep. 24, 2009

(51) Int. Cl.
*G21K 7/00* (2006.01)
*H01J 37/28* (2006.01)
*G01N 23/225* (2006.01)

(52) U.S. Cl. ....................... 250/311; 250/309; 250/310; 250/397

(58) Field of Classification Search ....................... None
See application file for complete search history.

(56) References Cited

U.S. PATENT DOCUMENTS 4,031,390 A * 6/1977 Muller et al. ............... 250/307
4,206,349 A * 6/1980 Kamimura .................. 250/311
4,385,317 A * 5/1983 Furuya et al. ................. 348/80
4,468,560 A * 8/1984 Kubozoe et al. ............ 250/311
4,514,629 A 4/1985 Smith et al.
4,651,220 A 3/1987 Hosoi et al.
4,680,469 A * 7/1987 Nomura et al. ............. 250/311
4,691,103 A 9/1987 Le Poole et al.
4,695,725 A * 9/1987 Mori et al. .................. 250/583
4,739,399 A 4/1988 Swann et al.
4,942,300 A * 7/1990 Mori et al. .................. 250/583
5,013,915 A 5/1991 Isakozawa et al.
5,065,029 A * 11/1991 Krivanek ............... 250/441.11
5,401,964 A * 3/1995 Mancuso .................... 250/307
5,517,033 A * 5/1996 Krivanek et al. ............ 250/397
5,519,227 A 5/1996 Karellas
5,536,941 A * 7/1996 Swann ........................ 250/311
5,635,720 A * 6/1997 Mooney et al. ............. 250/397
6,061,085 A * 5/2000 Daberkow et al. ............ 348/80
6,414,309 B2 * 7/2002 Mooney et al. ............. 250/311
6,570,164 B2 * 5/2003 Mooney ..................... 250/397
7,138,629 B2 * 11/2006 Noji et al. ................... 250/311
7,154,091 B2 * 12/2006 Zewail et al. ............... 250/311
2009/0086892 A1 * 4/2009 Boyden et al. ................ 378/44
2009/0220256 A1 * 9/2009 Suhara et al. ................. 399/32
2009/0236520 A1 * 9/2009 Fama et al. ................. 250/307
2009/0302218 A1 * 12/2009 Suhara ....................... 250/310

* cited by examiner

*Primary Examiner*—David A Vanore
(74) *Attorney, Agent, or Firm*—Cesari and McKenna, LLP

(57) ABSTRACT

A method and apparatus allowing for simultaneous direct viewing and electronic capture of images in an electron microscope (TEM). For this, the usual opaque direct viewing plate in the TEM is replaced in form and in function by a two-sided direct viewing plate including at least one scintillator. This plate produces light emissions from both its upper and lower surfaces, which allows an electronic camera below the plate to be used simultaneously with direct human viewing from above the plate. The method and apparatus are also compatible with traditional permanent image recording units that are often desired in such microscopes.

31 Claims, 5 Drawing Sheets

METHOD AND APPARATUS ALLOWING SIMULTANEOUS DIRECT OBSERVATION AND ELECTRONIC CAPTURE OF SCINTILLATION IMAGES IN AN ELECTRON MICROSCOPE

This invention relates to an electron microscope. It relates especially to a method and apparatus allowing simultaneous direct observation and electronic capture of scintillation images produced in an electron microscope.

BACKGROUND OF THE INVENTION

A transmission electron microscope (TEM) creates images by generating an electron beam that penetrates a very thin specimen. The projected image of electron intensity corresponds to the specimen structure. In order to reduce that intensity image to visible form, the image must be converted to a signal. In a TEM, that signal is generated by impact of the electron pattern onto a scintillator, a photographic emulsion or solid-state imaging plate, or onto the photosensitive element of an electronic camera. A scintillator is normally used for direct, live human viewing or as the input to an electronic camera, which can provide both real-time and recorded images. Photo-emulsions and imaging plates produce recorded images only.

FIG. 1 shows a conventional TEM 10 supported on a table T. TEM 10 includes a housing 12 having an upper cylindrical column or section 12*a*, which extends down to an enlarged lower section 12*b* that defines an interior observation chamber 14 at the foot of the column. An operator sitting in front of table T facing housing 12 can view chamber 14 through an x-ray shielding observation window 16 in housing section 12*b*. Housing 12 is maintained under a relatively high vacuum and an electron gun 18 at the top of section 12*a* generates an electron beam e within the housing.

Under the influence of electromagnetic lenses (not shown) in column 12*a*, beam e is transmitted along an optical axis A through a specimen S removably positioned by a support 20 in column 12*a*. The beam e, now including an electron pattern corresponding to the structure of a selected area of specimen S, is projected onto a scintillator 22*a* on the upper surface of an opaque direct viewing plate 22 centered on axis A within chamber 14. Invariably the usual plate comprises a relatively thick flat metal substrate whose upper surface is coated with a scintillator such as phosphorus. Typically, plate 22 has a surface area that is large enough to be watched comfortably by an operator looking at the plate through window 16. Such direct viewing plates typically range from 25 to 150 mm in diameter.

In response to the impinging electrons, plate 22 produces a visible image at its upper surface corresponding to the electron pattern which image is visible to the operator looking through window 16. Typically, he/she views plate 22 at an angle of about 45°.

Usually control units 24 and 26 are positioned on table T on opposite sides of housing 12. These units control the TEM, enabling the operator to shift the electron beam e relative to specimen S (or vice versa), so that various areas of the specimen may be viewed on plate 22. Thus, while directly viewing the image on plate 22 and manipulating various controls C on units 24 and 26, respectively, using both hands the operator may align the electron beam and survey the specimen S in a very ergonomic and efficient manner.

Aside from ease of use, many TEM users prefer to operate the TEM while directly viewing the specimen image on plate 22 because TEMs have historically been optimized for this type of observation so that the visible image on the plate 22 is characterized by relatively high resolution, wide dynamic range of response and low apparent noise.

Many TEMs, particularly those built before 2007, usually also include a permanent image recording unit 32 below the observation chamber 14. Since the electron beam e is projected into the recording unit 32, that unit must be maintained under the same vacuum as housing 12 when the TEM is in operation. The unit 32 may temporarily position a recording medium such as film F from the unit's supply tray 32*a* to a fixed location on axis A as shown before transferring that film to a storage tray 32*b*. When the specimen S has been surveyed and the desired area thereof has been imaged on plate 22, the plate may be swung up out of the way to the position shown at 22' so that the electron beam e is projected onto and exposes the film F on axis A, thereby providing a permanent copy of that area of the specimen.

Of course, the recording unit 32 may record images on other recording media such as conventional imaging plates instead of on film F.

As alluded to above, some conventional TEMs also include means for producing real-time images corresponding to the specimen structure captured in the electron pattern in beam e. These images may be displayed on a monitor/recorder 28, positioned on table T next to housing 12. The input signal to monitor 28 may be provided by a conventional electronic camera having a dedicated photosensitive screen which should be perpendicular to the optical axis of the camera to avoid distortion and to maintain high optical performance. This requirement for perpendicularity arises because a high numerical aperture is needed to provide the required sensitivity and resolution for electronic recording. The usual optical couplers and lenses in the camera have a depth of field in the order of only 20 μm so that a deviation from such perpendicularity of only a few degrees would be detrimental to the image focus. This is the main reason why an electronic camera cannot simply acquire pictures suitable for recording on the opaque viewing plate 22 through the observation window 16; i.e. as noted above, that window is oriented at a large angle (45°) with respect to the plate.

In practice, then, the electronic camera that provides the signal to monitor 28 is often mounted in the side of housing column 12*a*, above chamber 14 as shown at 34 in FIG. 1. The housings of many TEMs include a port 36 with a window 36*a* in the wall of column 12*a* for this purpose. In this event, the camera's photosensitive screen 38 may be at the upper surface of a prism 42 located directly opposite port 36 so that screen 38 is perpendicular to axis A. Prism 42 may be mounted to the armature 44*a* of a linear actuator 44 secured to the side of housing section 12*a* opposite the camera 34. Under the control of a controller 46, the actuator 44 may move the prism 42 to an extended position shown in solid lines in FIG. 1 wherein the screen 38 is centered on axis A and any visible image thereon is reflected by prism 42 to camera 34 such that the reflected image is also perpendicular to the optical axis of the camera. In response to the incoming image from screen 38, camera 34 provides a signal to monitor 28, causing the monitor to display and/or record that image.

The prism 42 may also be moved by actuator 44 to a retracted position shown in phantom in FIG. 1. In this position, the phosphor screen 38 is not impinged by beam e. Rather, the beam carries on to form a visible image on the direct viewing plate 22 in observation chamber 14. Obviously, the two members 22 and 38 cannot be imaged by beam e simultaneously.

Instead of, or in addition to mounting the electronic camera above the direct viewing plate 22 as described above, some conventional TEMs provide for such mounting on axis A below that plate. In the event that the TEM includes a permanent imagine recording unit such as unit 32 in FIG. 1, the camera may be mounted to the underside of unit 32 as shown at 52 in FIG. 1. For this purpose, the bottom wall of unit 32 may include a port 54 covered by a photosensitive screen 58 optically coupled to the camera by a lens device 59. In such a TEM, means are provided for swinging the direct viewing plate 22 up and away from axis A as shown in phantom at 22' in FIG. 1. When plate 22 is in this out-of-the-way position and no film F is positioned by unit 32 on axis A, the electron beam e may be projected directly onto the screen 58. The screen thereupon produces a visible image corresponding to the electron beam image of specimen S which visible image is viewed by camera 52 and displayed on monitor 28. Here again, the opaque direct viewing plate 22 and the camera screen 58 cannot be imaged at the same time by the electron beam e.

Conventional electron microscopes such as those outlined above are described, for example, in U.S. Pat. Nos. 4,206,349; 4,739,399 and 5,013,915. Such TEMs are disadvantaged in several respects. First, as noted above, each electronic camera requires its own dedicated photosensitive screen which, when operational, must be located within the evacuated housing 12 on axis A. This requires that the camera and its screen be spaced well above or below the direct viewing plate 22 so as not to interfere with the exposure of the direct viewing plate by electron beam e. When the camera screen is located above the direct viewing plate 22 as at 38 in FIG. 1, that screen must be movable or retractable from axis A so as not to interfere with the imaging of the direct viewing plate 22. This necessitates the presence of the described mechanisms and x-ray-compatible shielding window which increase the overall cost and complexity of the microscope.

On the other hand, if the photosensitive screen for the electronic camera is located below the direct viewing plate 22 as at 58 in FIG. 1, a mechanism must be provided in order to move that plate 22 away from axis A so that beam e can be projected onto the camera screen 58, also adding to the cost and complexity of the instrument. This is especially true of TEMs which include a permanent recording unit such as unit 32 in FIG. 1. Because of the presence of the camera's screen 58, each time a film F is retrieved from unit 32, the entire housing 12 including unit 32 must be pumped down to the high vacuum necessary to subsequently operate the TEM. This also adds to the overall cost of the apparatus.

Finally, it should be emphasized that the electromagnetic optics in a conventional TEM are designed specifically to optimize the image on the direct viewing plate 22 because this is the image that many operators prefer to view through window 16 while aligning the electron beam and surveying specimen S, even though such TEMs may include an electronic camera and associated display monitor. This is because, as noted above and as depicted in FIG. 2, when the camera's photosensitive screen is located above plate 22 as at 38 in FIG. 2, the visible image on that screen 38 produced by beam e is characterized by a lower resolution, e.g. 1-4 megapixels, and higher distortion as compared with the visible image produced on plate 22 which may have a resolution as high as 10-16 megapixels. On the other hand, when the electronic camera's scintillation screen is located below the direct viewing plate 22 as at 58 in FIG. 2, it is highly cropped as compared to the visible image on plate 22. No wonder, then, that many operators prefer to directly view the image on plate 22 when surveying a specimen.

SUMMARY OF THE INVENTION

Accordingly, the present invention aims to provide an electron microscope (TEM) including a direct viewing plate and an electronic camera which optimizes the performance of the camera while maintaining the ergonomic advantages of an operator being able to simultaneously observe a specimen image on the direct viewing plate of the TEM.

Another object of the invention is to provide such a microscope which still allows for the operation of a permanent image recording unit found on many TEMs in use today.

Another object of the invention is to provide a TEM of this type including an electronic camera that is able to capture an image that is located at the optimum design location in the microscope.

A further object of the invention is to provide an electron microscope which allows an operator to observe an image on the TEM's direct viewing plate from above, while simultaneously allowing an electronic recording device to simultaneously capture the very same image from below that plate.

A further object of the invention is to provide a method of converting a conventional electron microscope to a microscope having one or more of the above advantages.

Other objects will, in part, be obvious and will, in part, appear hereinafter. The invention accordingly comprises the several steps and the relation of one or more of such steps with respect to each of the others, and the apparatus embodying the features of construction, combination of elements and arrangement of parts which are adapted to effect such steps, all as exemplified in the following detailed description, and the scope of the invention will be indicated in the claims.

Briefly, in accordance with our invention, a more or less conventional TEM is modified by substituting for the usual opaque direct one-sided viewing plate in the observation chamber of that TEM a two-sided direct viewing plate, meaning that it is observable from both sides. This allows the visible image formed on the upper surface of the plate by an electron beam to be viewed from above by an operator looking through the window of the TEM's observation chamber and simultaneously from below by an electronic recording device positioned below that plate. Resultantly, the performance of the electronic recording device may be optimized while still maintaining the ergonomic advantages of an operator being able to simultaneously observe the image on the direct viewing plate while surveying a specimen. As we shall see, the invention is even compatible with TEMs which include a permanent image recording unit located below the observation chamber.

BRIEF DESCRIPTION OF THE DRAWINGS

For a fuller understanding of the nature and objects of the invention, reference should be made to the following detailed description, taken in connection with the accompanying drawings, in which.

DESCRIPTION OF THE PREFERRED EMBODIMENTS

Figure 3A:
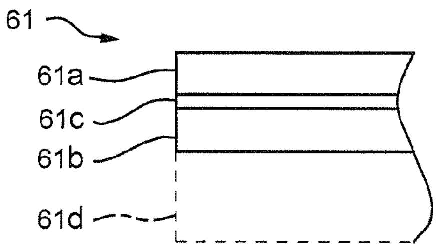
FIG. 3A is a scrap view of a modified direct viewing plate for use in our microscope.
Figure 3:
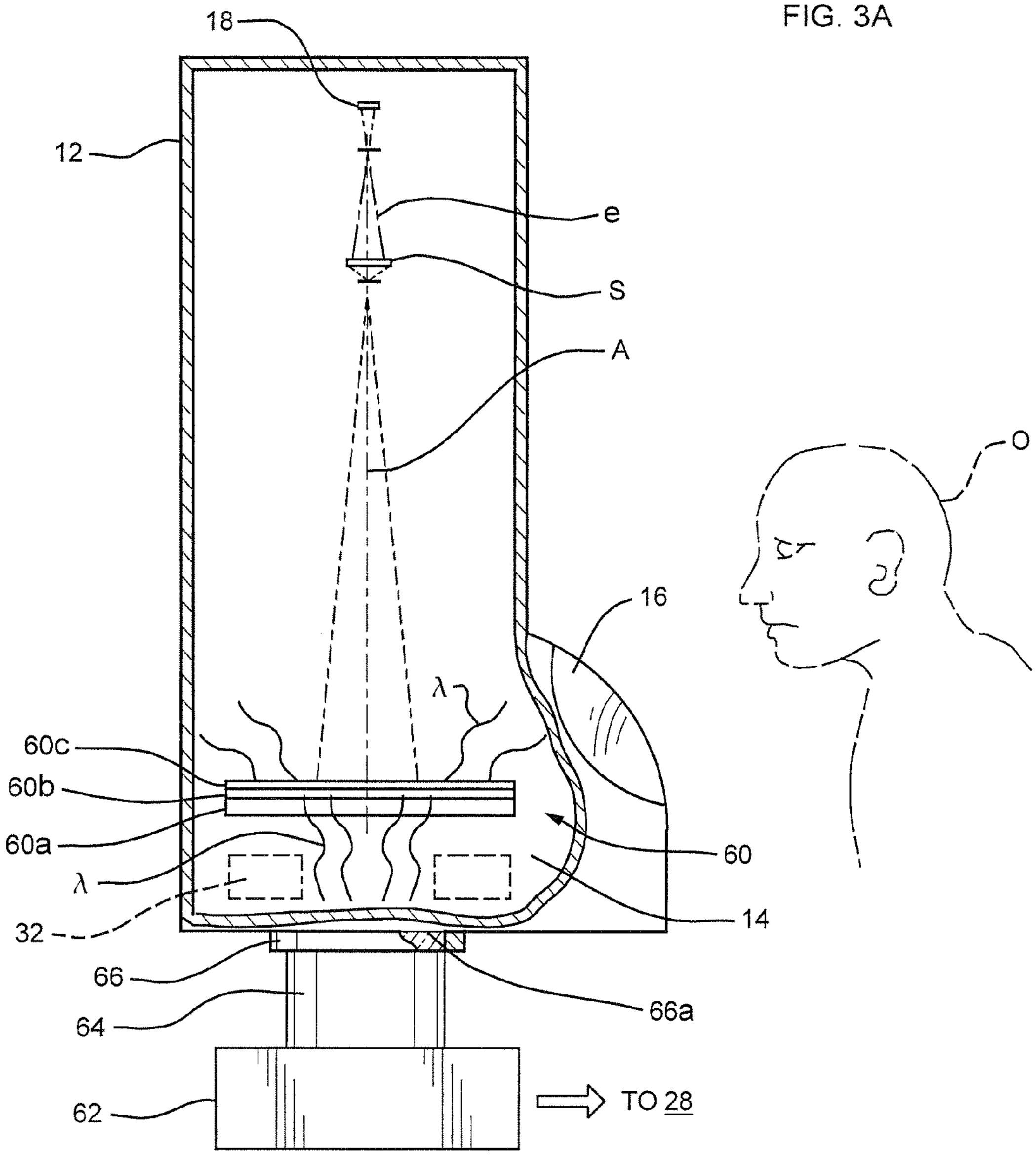
FIG. 3 is a diagrammatic view of an electron microscope incorporating the invention in a first configuration.

FIG. 3 illustrates diagrammatically an electron microscope incorporating our invention. Since this microscope contains many of the same components described above in connection with FIG. 1, the same numeric identifiers are used to refer to those similar components in the description of FIG. 3.

Figure 1:
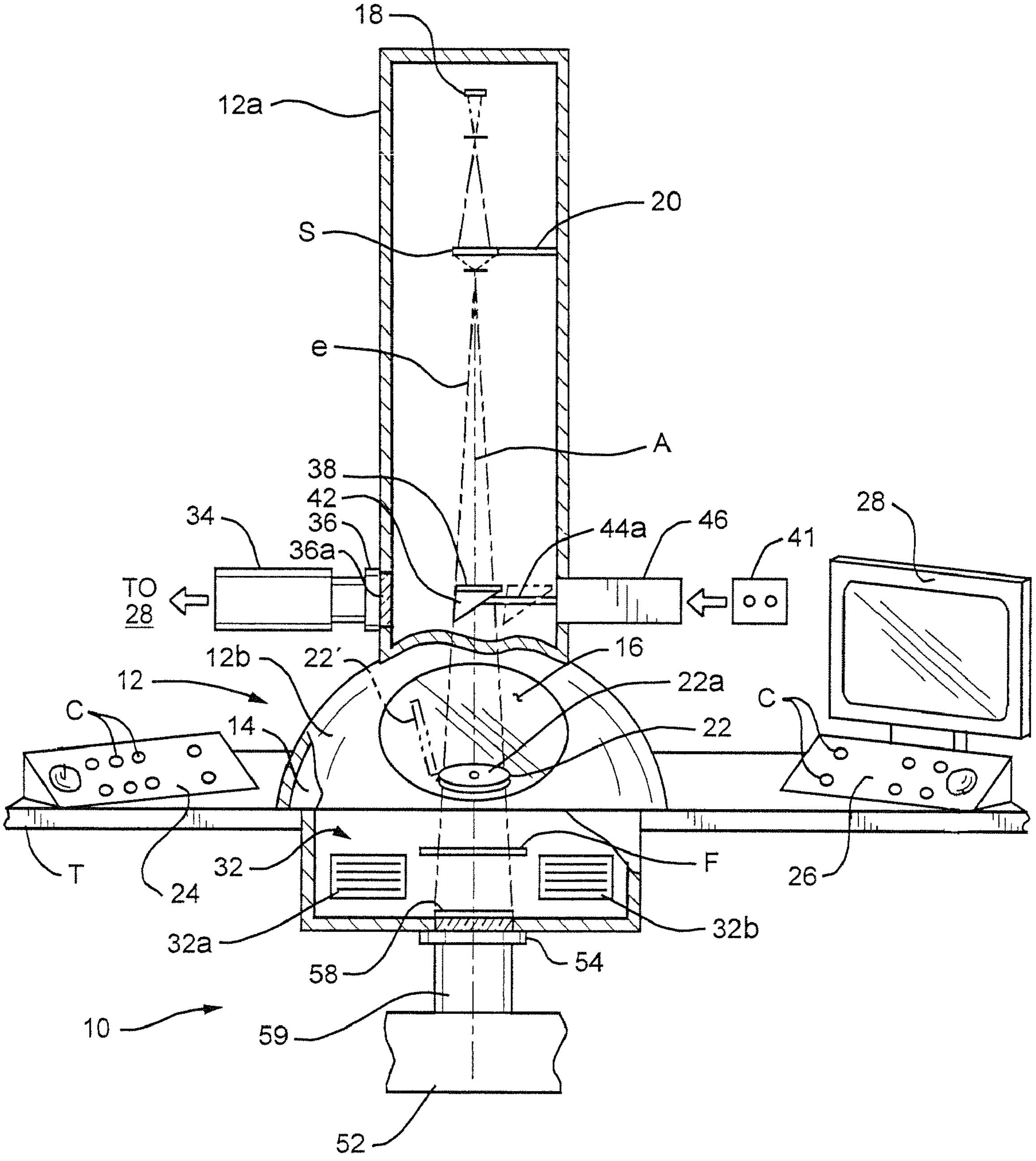
FIG. 1, already described, is an elevational view with parts in section showing a conventional electron microscope.

The FIG. 3 TEM is similar to the FIG. 1 instrument in that it includes a housing 12, with a window 16 in a wall of the housing's observation chamber 14 that allows an operator O to view the interior of that chamber. An electron gun 18 at the top of housing 12 transmits an electron beam e along an optical axis A through a specimen S. However, the FIG. 3 microscope differs markedly from conventional TEMs in that the electron beam e passing through specimen S is projected onto a direct viewing plate indicated at 60 which shows the TEM image from both sides of the plate.

More particularly, plate 60 comprises a transparent substrate 60*a*, e.g. of glass. The top surface of that substrate is covered by a transparent, electrically conductive coating, e.g. indium tin oxide, which constitutes a transparent electrode 60*b*, which may be electrically grounded by way of the wall of housing 12. Electrode 60*b* is, in turn, coated with a scintillator 60*c*, such as phosphor P20 or P43, depending on the desired wavelength of the light emissions from plate 60.

FIG. 3A shows another direct viewing plate embodiment 61 which may be used in lieu of plate 60.

Plate 61 is constructed as a composite of an upper layer 61*a* and a lower layer 61*b* of phosphor separated by an electrically conductive, light-reflecting opaque film 61*c*, which may be electrically grounded by way of the wall of housing 12. This composite structure can be either self-supporting or it can be deposited on a glass substrate 61*d*. The top phosphor layer 61*a* may be viewed from above while the bottom phosphor layer 61*b* is viewed from below, each layer being optimized for its individual purpose.

The TEM embodiment depicted in FIG. 3 happens not to include a permanent image recording unit such as unit 32 in FIG. 1. Rather, an electronic camera 62 is mounted to the bottom wall of housing 12 by way of a lens device 64 whose optical axis is coincident with axis A. A port 66 with a window 66*a* may be provided in the bottom wall of housing 12 for this purpose. The lens device 64 has a focal length that optically couples camera 62 to the scintillator 60*c* of plate 60.

When the FIG. 3 TEM is in operation, the direct viewing plate 60 responds to the electron beam e by producing a visible image at its upper surface which corresponds to the structure of specimen S. Since plate 60 is transparent, the visible light emissions λ produced by the scintillator 60*c* may be seen from above the plate by an operator O looking through window 16. Light emissions λ also pass through the transparent electrode 60*b* and the transparent substrate 60*a* and thus may be viewed from below the plate by camera 62.

In the case of plate 61, both phosphor layers 61*a* and 61*b* will produce identical visible images of the specimen S in response to beam e so that the plate 61 as a whole may be viewed from above and below in the same way as plate 60.

Figure 2:
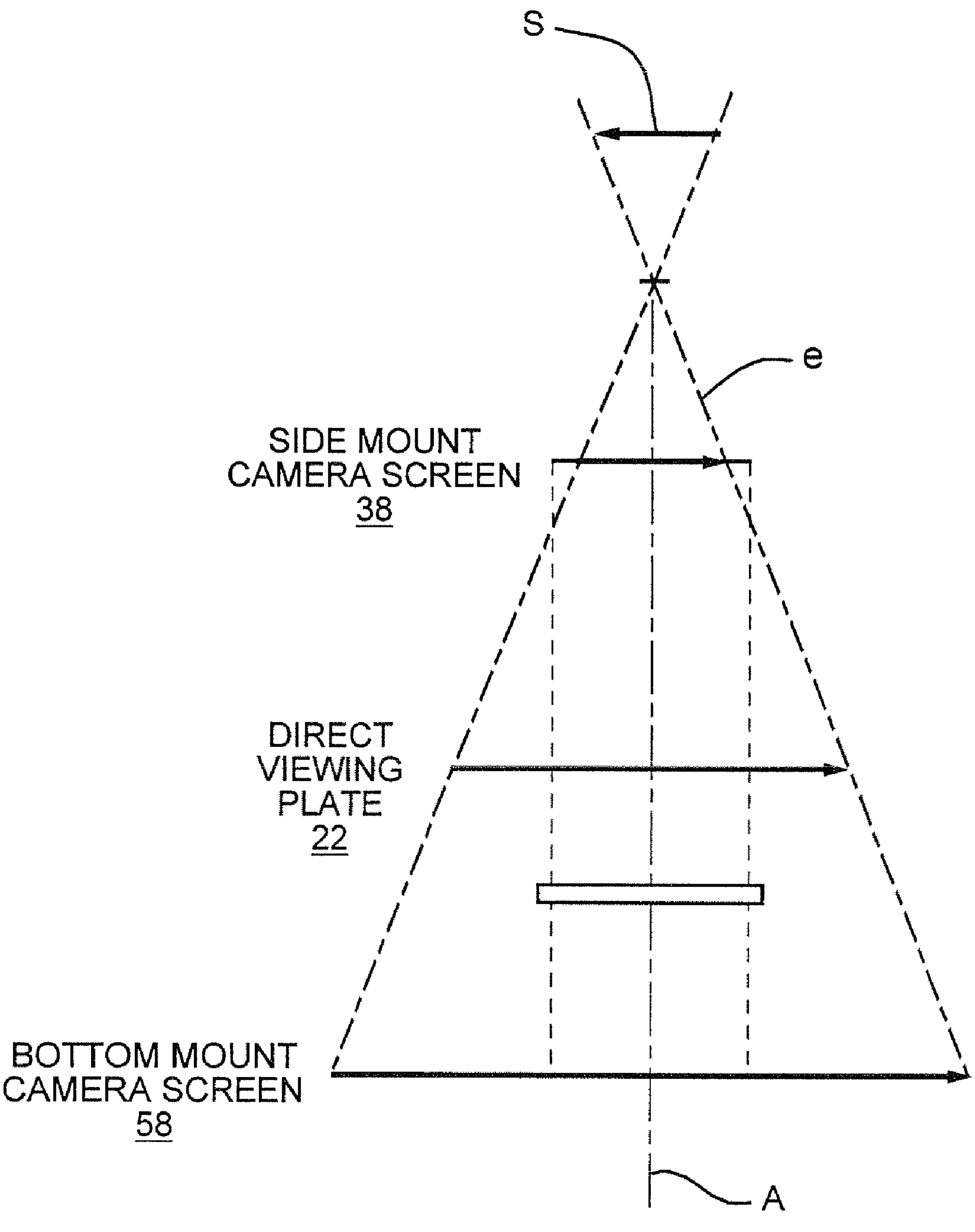
FIG. 2 is a diagrammatic view showing the operation of the FIG. 1 microscope.

The transparent direct viewing plate 60 or 61 is located at the "sweet spot" of the TEM. This is the location in the housing at which the field of view is relatively large, yet the magnification of the image projected onto plate 60 or 61 is high enough to operate the TEM at its highest resolution. Resultantly, the images captured by the camera and recorded by monitor 28 (FIG. 1) have optimum resolution and sensitivity as compared with the camera images of prior TEMs developed on dedicated camera screens located above or below the direct viewing plate as in FIG. 2. Thus, the FIG. 3 TEM offers the best of both worlds in that it allows the operator O to view the image on plate 60 or 61 while aligning beam e and surveying specimen S using the control units 24 and 26 shown in FIG. 1, while that very same image is being captured in real time by camera 62 for display and/or recording by monitor 28.

Figure 4:
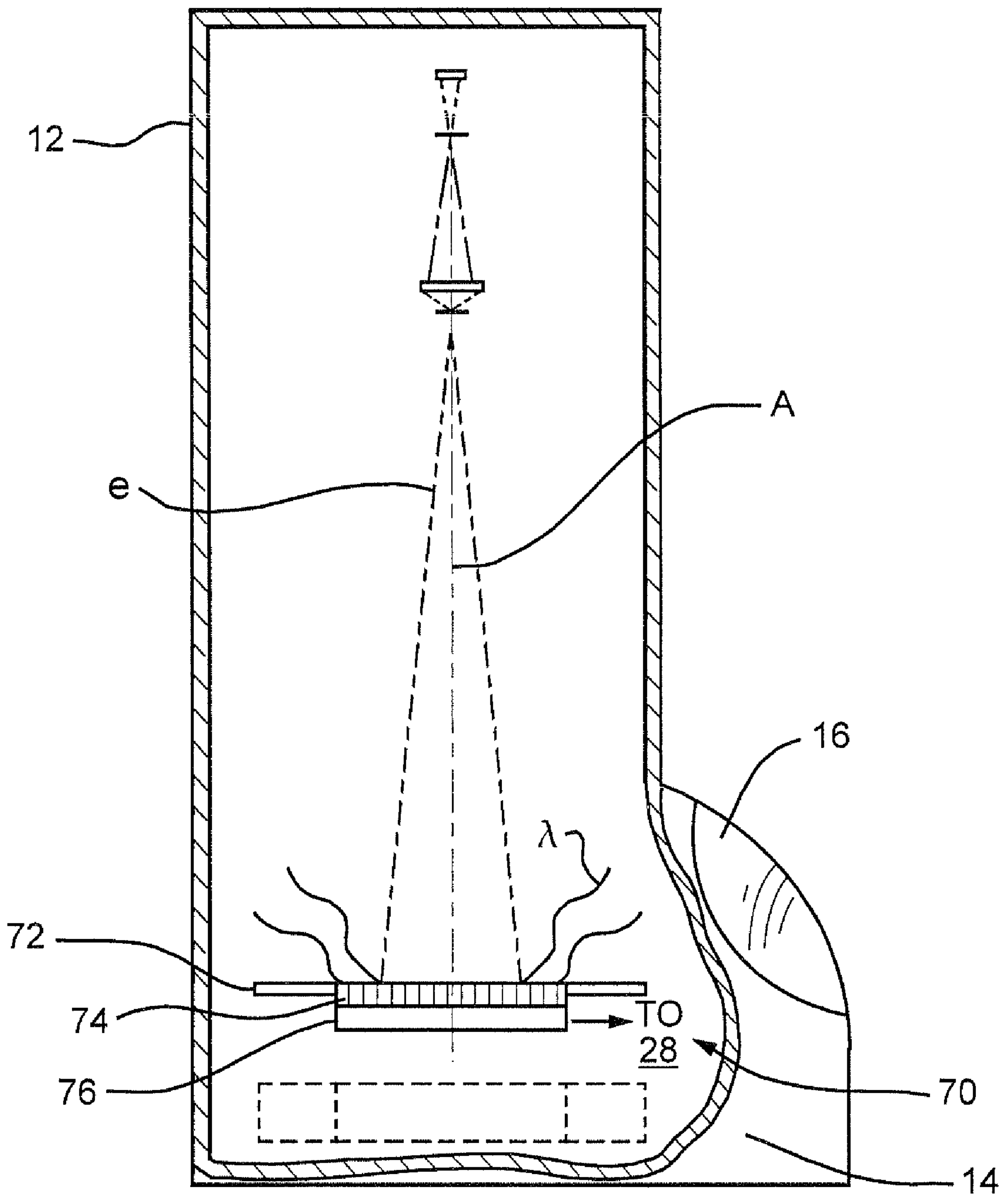
FIG. 4 is a view similar to FIG. 3 of the microscope in a second configuration.

FIG. 4 shows a TEM embodiment in which an electronic camera indicated at 70 is fiberoptically coupled directly to the underside of a transparent direct viewing plate 72 which may be similar to plate 60 or 61. In this case, a fiberoptic faceplate 74 is incorporated into the transparent substrate of viewing plate 72 and the camera comprises a CCD sensor 76 optically coupled to the faceplate. If necessary, sensor 76 may be cooled by a thermoelectric cooler (not shown) positioned flush against the underside of the sensor. When the electron beam e impinges on plate 72, the scintillator 60*c* or 61*a* thereof produces a visible image which may be viewed from above through window 16. That very same image or an identical one is coupled by the faceplate 74 to sensor 76 which thereupon produces a corresponding output signal. That output signal may be applied to a monitor such as monitor 28 in FIG. 1 which will provide a real time display of that image for simultaneous viewing and/or recording by the operator.

As described at the outset, many TEMs in use today include a permanent image recording unit such as the photographic recording unit 32 in FIG. 1. This is because many operators consider a photographic image to be the image "goal standard" in terms of the resolution and overall quality of the image, even surpassing the quality of the images captured by present-day electronic cameras.

Figure 5:
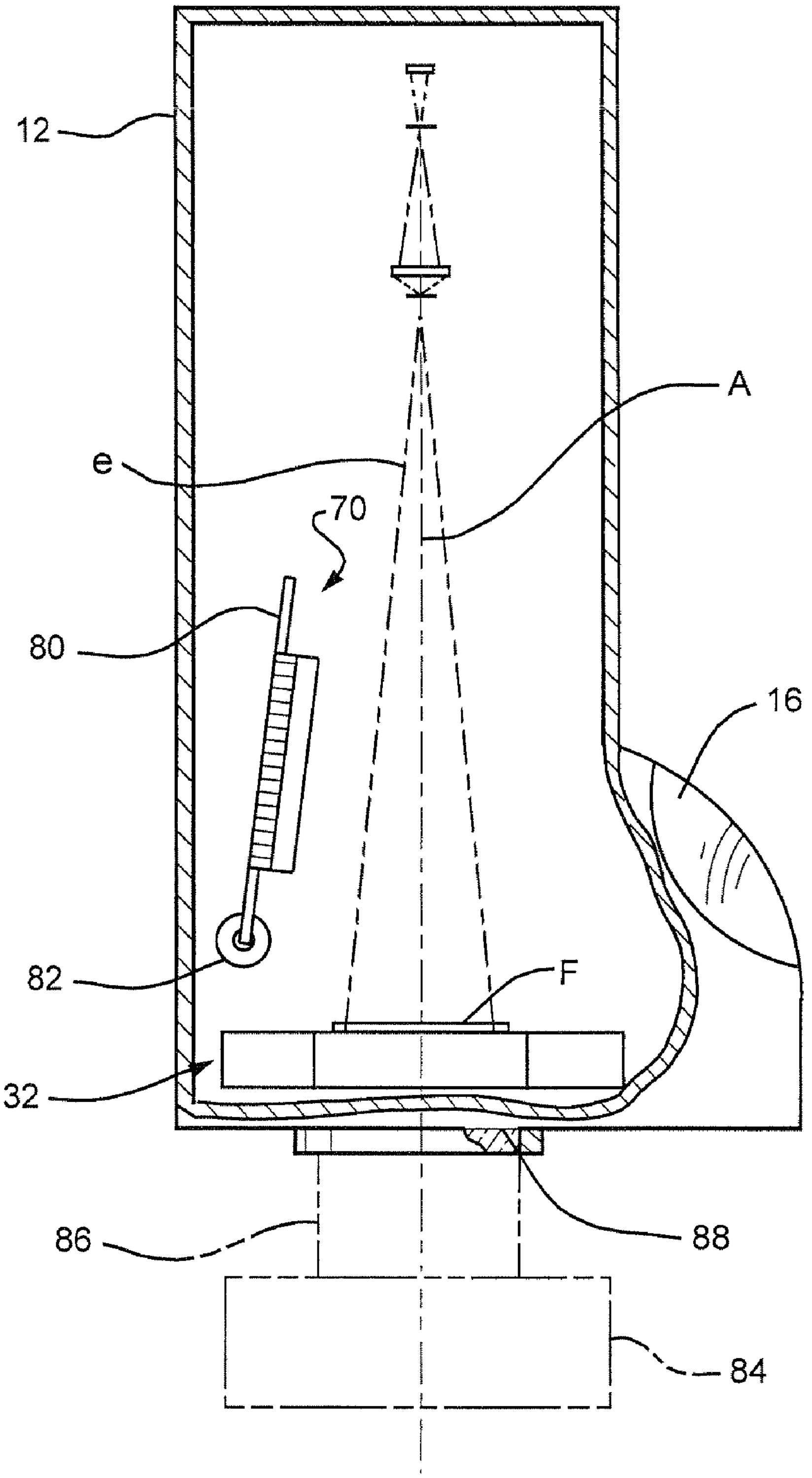
FIG. 5 is a similar view of the microscope in a third configuration.

FIG. 5 illustrates a TEM incorporating our invention which also includes a permanent image recording unit 32 as in FIG. 1 and, as in FIG. 1, has a direct viewing plate 80 which may be moved by a rotary actuator 82 from a position wherein the plate is centered on axis A as shown in FIG. 1 to the position shown in FIG. 5 wherein the plate is swung up away from axis A. Unlike the plate 22 in FIG. 1, however, the plate 80 in the FIG. 5 TEM is transparent and may be substantially identical to plate 72 in FIG. 4, i.e. it has an electronic camera 70 fiberoptically coupled to the underside of the plate. When that plate is centered on axis A and exposed to the electron beam e, the operator may view the visible image on plate 80 from above while that very same image is captured by the electronic camera 70 at the underside of that plate for display on monitor 28 (FIG. 1). On the other hand, when the direct viewing plate 80 is swung to the position shown in FIG. 5, the electron beam e may expose a film F on axis A in unit 32 to provide a permanent photographic quality copy of the image captured by the electron beam e.

The FIG. 5 TEM could also incorporate a direct viewing plate similar to plate 60 or 61 in FIG. 3 and have an underlying electronic camera on axis A that is lens-coupled to that plate. A camera such as this is shown in phantom at 84 in FIG. 5, connected via a lens device 86 to a port 88 in the bottom wall of recording unit 32. When the direct viewing plate is centered on axis A as shown in FIG. 3 and no film F is present on axis A, camera 84 may capture the visible image produced on plate 84 by the electron beam e.

In this case, since the camera does not have a dedicated photosensitive screen inside unit 32 as in FIG. 1, the interior of unit 32 may be partitioned off from housing 12 and a window provided in the partition so that camera 84 may view plate 60 through that window. Thus, a vacuum may be maintained in housing 12 when unit 32 is opened to remove or insert film F.

Although our invention may be incorporated into newly manufactured TEMs, most existing TEMs may be modified to include the invention using a relatively simple conversion kit consisting of a transparent direct viewing plate, such as plate 60, to replace the existing opaque viewing plate, e.g. plate 22 (FIG. 1) and a lens device to replace the standard couplers, e.g. device 59 in FIG. 1, for coupling to the port 66 or 88 at the underside of housing 12. That replacement device should be of the proper focal length to optically couple an electronic camera to the operative scintillator of the trans-parent plate 60, 61, 72 or 80.

It will thus be seen that the objects set forth above among those made apparent from the preceding description are efficiently attained and, since certain changes may be made in carrying out the above method and in the constructions set forth above without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention described herein.

The invention claimed is:

1. A method for imaging a specimen in an electron microscope comprising the steps of passing a beam of electrons along an axis through said specimen to produce a transmitted beam containing in an electron pattern information about the specimen and projecting said beam onto a scintillator of a two-sided direct viewing plate positioned on said axis thereby creating a corresponding pattern of emitted light that may be observed obliquely from above the plate by a human observer and/or from directly below the same plate by an electronic camera positioned on said axis, said transparent plate being removable so that the transmitted beam may expose a permanent image recording medium positioned on said axis by a support.

2. The method defined in claim 1 wherein said two-sided direct viewing plate is formed with a transparent substrate having a top surface, a transparent electrically conductive coating on said top surface, and said scintillator covers said electrically conductive coating.

3. The method defined in claim 1 wherein said two-sided direct viewing plate is formed as a composite structure comprising a pair of scintillation layers separated by an electrically conductive, light reflecting layer, said beam being projected onto both scintillation layers.

4. The method defined in claim 3 wherein the composite structure is supported by a transparent substrate in face-to-face contact with one of the scintillation layers.

5. The method defined in claim 1 wherein the recording medium comprises a solid state imaging plate supported by the support.

6. The method defined in claim 5 wherein the camera is lens-coupled to the scintillator.

7. The method defined in claim 5 wherein the camera is fiberoptically coupled to the scintillator.

8. The method defined in claim 5 wherein the solid state imaging plate is replaced by a second electronic camera positioned below the light transparent direct viewing plate.

9. The method defined in claim 5 wherein a second electronic camera is positioned below said support.

10. The method defined in claim 1 wherein the camera is lens-coupled to the scintillator.

11. The method defined in claim 1 wherein the camera is fiberoptically coupled to the scintillator.

12. The method defined in claim 1 wherein the recording medium comprises a photographic film.

13. The method defined in claim 1 wherein the camera is positioned on said axis below the permanent image recording medium.

14. The method defined in claim 1 wherein the two-sided direct viewing plate is viewed from above by a lens coupled electronic imaging device.

15. A method of converting a conventional electron microscope of the type including a housing defining a vertical column and an observation chamber at the foot of the column, said housing having a vertical axis, a support in the column for supporting a specimen on said axis, a one-sided opaque direct viewing plate positioned on said axis in said observation chamber, said opaque direct viewing plate extending perpendicular to said axis and having an upper surface, a viewing window in a wall of the observation chamber through which an observer may view the direct viewing plate obliquely from above, an electron beam generator in said column for transmitting an electron beam along said axis through a specimen on said specimen support, and means in said column for projecting the transmitted electron beam along said axis onto the direct viewing plate to form a visible image on the upper surface thereof corresponding to the specimen supported by the specimen support to an electron microscope in which the visible image formed on the opaque direct viewing plate can be viewed from above by an observer looking through said window and simultaneously recorded electronically from below comprising the steps of substituting for said opaque one-sided direct viewing plate a two-sided direct viewing plate including a scintillator;

positioning an electronic recording device on said axis below the two-sided direct viewing plate, and optically coupling said device to the scintillator.

16. The method defined in claim 15 wherein the two-sided direct viewing plate is formed with a transparent substrate having a top surface, a transparent electrically conductive coating on said top surface, and said scintillator covers said electrically conductive coating.

17. The method defined in claim 15 wherein said two-sided direct viewing plate is formed as a composite structure comprising a pair of layers separated by an electrically conductive, light reflecting layer, said beam being projected onto both scintillation layers.

18. The method defined in claim 15 and further including forming said electronic recording device as an electronic camera lens-coupled to said scintillator.

19. The method defined in claim 15 including the step of forming said electronic recording device as a CCD sensor mounted to a bottom surface of said two-sided direct viewing plate by way of a fiberoptic faceplate.

20. The method defined in claim 15 and further including providing a permanent image recording device below the two-sided direct viewing plate, said recording device including means for temporarily positioning a recording medium on said axis, and providing means for moving the two-sided direct viewing plate away from said axis so that the projected electron beam impinges directly on the recording medium.

21. An electron microscope of the type including a housing defining a vertical column and an observation chamber at the foot of the column, said housing having a vertical axis, a support in the column for supporting a specimen on said axis, a direct viewing plate positioned on said axis in said observation chamber, said direct viewing plate extending perpendicular to said axis and having an upper surface, a viewing window in a wall of the observation chamber through which an observer may view the direct viewing plate obliquely from above, an electronic recording device positioned on said axis below the direct viewing plate, an electron beam generator in said column for transmitting an electron beam along said axis through said specimen, and electromagnets in said column for projecting the transmitted electron beam along said axis onto the direct viewing plate to form a visible image on the upper surface thereof corresponding to the structure of said specimen, the improvement wherein the direct viewing plate is a two-sided direct viewing plate so that the visible image formed thereon by said electron beam can be viewed from above by an observer looking through said window and simultaneously from below by said electronic recording device.

22. The microscope defined in claim 21 wherein said two-sided direct viewing plate comprises a transparent substrate having a top surface and a bottom surface;

a transparent, electrically conductive coating on said top surface, and a scintillator covering the conductive coating and forming said upper surface of the direct viewing plate.

23. The microscope defined in claim 21 wherein said two-sided direct viewing plate is a composite structure comprising a pair of scintillation layers separated by an electrically conductive, light reflecting layer.

24. The microscope defined in claim 23 wherein the composite structure is supported by a transparent substrate in face-to-face contact with one of the scintillation layers.

25. The microscope defined in claim 21 wherein the electronic recording device comprises a CCD sensor, optically coupled to one side of the two-sided direct viewing plate by a fiberoptic faceplate.

26. The microscope defined in claim 21 wherein the electronic recording device comprises an electronic camera spaced below the two-sided direct viewing plate and having an input aperture on said axis, and a lens device for optically coupling the visible image formed on the two-sided direct viewing plate to the camera aperture.

27. The microscope defined in claim 21 and further including a permanent image recording unit spaced below the two-sided direct viewing plate, said unit including an imaging medium and a transport mechanism for temporarily positioning the imaging medium on said axis, and a moving device for moving the two-sided direct viewing plate away from said axis so that the transmitted electron beam may be projected directly onto the imaging medium positioned on said axis.

28. The microscope defined in claim 27 wherein the imaging medium comprises photographic film.

29. The microscope defined in claim 27 wherein the imaging medium comprises a solid state imaging plate.

30. The microscope defined in claim 27 wherein the electronic recording device comprises an electronic camera positioned below the permanent image recording unit and having an input aperture on said axis, and a lens device optically coupling the visible image formed on the two-sided direct viewing plate to the camera aperture when the imaging medium is not positioned on said axis.

31. The microscope defined in claim 27 wherein the electronic recording device comprises a CCD sensor mounted to the two-sided direct viewing plate by way of a fiberoptic faceplate.

* * * * *